United States Patent [19]

Jaeger et al.

[11] Patent Number: 4,912,600
[45] Date of Patent: Mar. 27, 1990

[54] INTEGRATED CIRCUIT PACKAGING AND COOLING

[75] Inventors: Richard C. Jaeger; John S. Goodling, both of Auburn, Ala.; Norman V. Williamson, Pascagoula, Miss.

[73] Assignee: Auburn Univ. of the State of Alabama, Auburn, Ala.

[21] Appl. No.: 241,184

[22] Filed: Sep. 7, 1988

[51] Int. Cl.$^4$ .............................................. H05K 7/20
[52] U.S. Cl. ................................ 361/385; 165/80.4; 165/104.33; 174/15.1; 357/82; 361/382
[58] Field of Search ................. 165/804, 86.5, 104.33, 165/104.34; 174/15.1, 15.2, 16.1, 16.3; 357/79, 82; 361/381, 382, 385-389

[56] References Cited

U.S. PATENT DOCUMENTS

| | | | |
|---|---|---|---|
| 2,906,103 | 9/1959 | Saltzman | 174/15.1 |
| 4,138,692 | 2/1979 | Meeker et al. | 165/80.4 |
| 4,407,136 | 10/1983 | de Kanter | 165/104.33 |
| 4,729,424 | 3/1988 | Mizuno et al. | 174/15.1 |
| 4,750,086 | 6/1988 | Mittal | 361/382 |
| 4,772,980 | 9/1988 | Curtis et al. | 361/385 |

FOREIGN PATENT DOCUMENTS

| | | | |
|---|---|---|---|
| 0091733 | 10/1983 | European Pat. Off. | 361/381 |
| 0136349 | 6/1985 | Japan | 165/104.33 |
| 0658799 | 4/1979 | U.S.S.R. | 174/16.3 |
| 1352557 | 11/1987 | U.S.S.R. | 357/82 |

OTHER PUBLICATIONS

Crawford, "High-Power Electronic Device", IBM Technical Disclosure Bulletin, vol. 20, No. 11A, 4/78, pp. 4393-4398, 361/385.

Primary Examiner—Gregory Thompson
Attorney, Agent, or Firm—Irving M. Freedman

[57] ABSTRACT

A packaging and cooling structure for integrated circuit chips in electronic equipment is provided in which the chips are resiliently mounted on wafers which are centrally located in chambers within a housing. A liquid coolant is forced through orifices to spray the coolant on the wafers behind the chips and on the chips themselves providing both high velocity convective cooling and phase change boiling heat transfer. A temperature sensor and control are provided to sense and control the temperature within the electronic equipment.

16 Claims, 2 Drawing Sheets

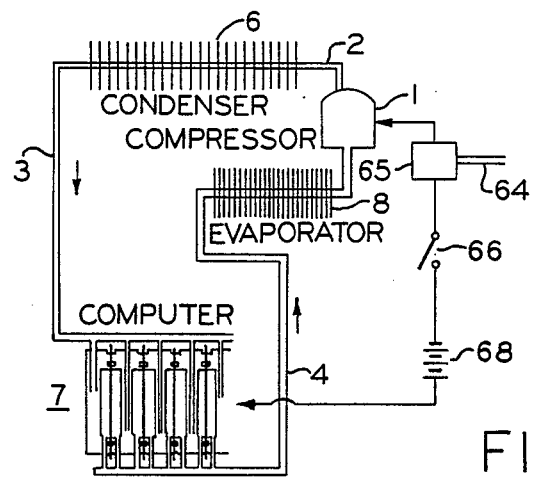
FIG_1
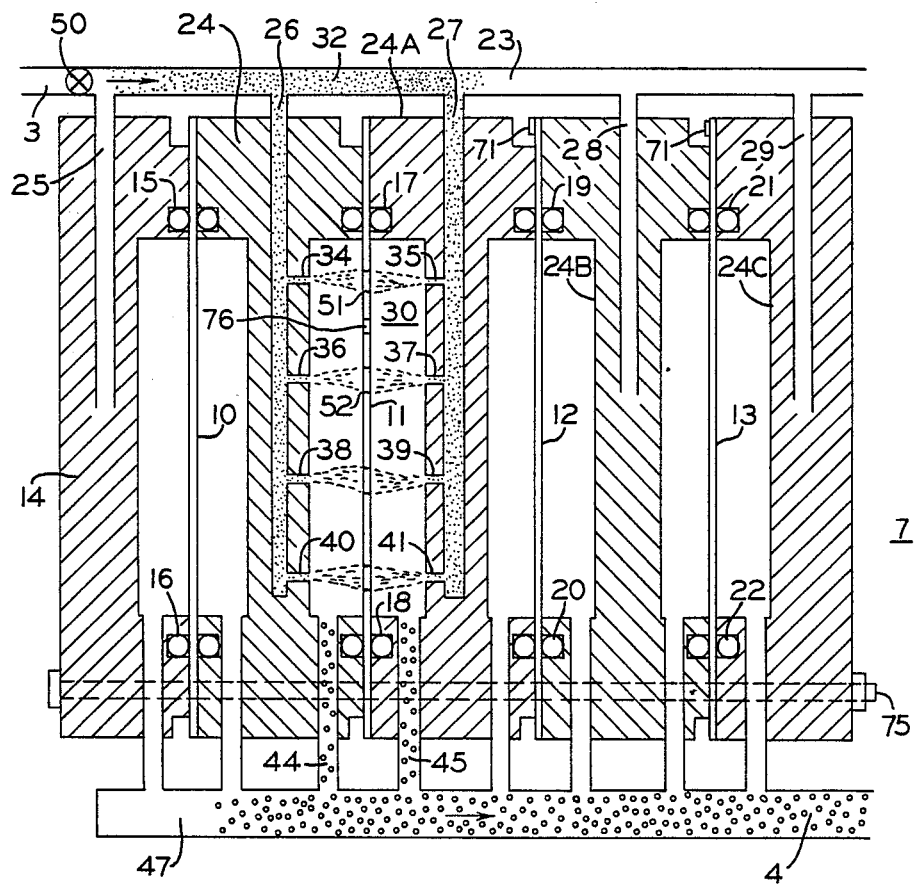
FIG_2

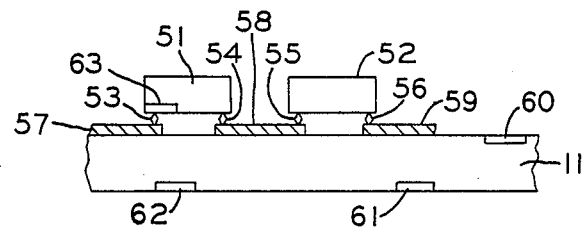
FIG_3
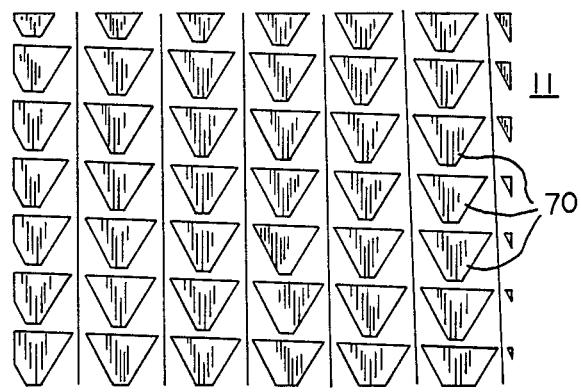
FIG_4

INTEGRATED CIRCUIT PACKAGING AND COOLING

BACKGROUND OF THE INVENTION

This invention relates to an improved cooling system for high density integrated circuits and, more particularly, a packaging and cooling system using jet impingement boiling heat transfer.

As the miniaturization and increasing complexity of integrated circuits continues, it is obvious that future generations of computers and other complex electronic system will be composed of increasingly high power, high density chips as both VSLI (very large scale integrated circuits) and chip-size continue to increase. One square centimeter chips will contain tens of millions of separate electronic components. Heat fluxes in integrated circuits are already in excess of 10 watts/square centimeter and are projected to reach 100 watts/square centimeter early in the next decade. In addition to the need for increased heat removal rates, mechanical stress in such systems and components due to differences in the expansion coefficients is becoming an increasing problem.

Traditional cooling techniques for thermal control such as free and forced gaseous and liquid convection as well as conduction and radiation or combinations of such methods are reaching the upper limits of heat removal rates. Jet impingement boiling cooling has been suggested.

OBJECTS AND SUMMARY OF INVENTION

It is the main object of the present invention to provide an improved packaging and cooling system for high density integrated circuits (ICs).

Another object of the present invention is to provide an improved IC packaging and cooling system which is readily assembled and disassembled and which minimizes the effects of inertial and thermal forces.

In carrying out the above, and other objects of the present invention, the integrated circuit chips are mounted on a wafer and the wafer is centrally positioned within a housing. A liquid coolant is forced through orifices in the housing to spray the coolant on the wafer behind the chips and/or on the chips themselves, providing both high velocity convective cooling and phase change boiling heat transfer. Means are provided to collect the coolant for return to the cooling system.

The foregoing and other objects, features, and advantages of the present invention will become apparent from the following more particular description of a preferred embodiment of the invention, as illustrated in the accompanying drawings.

BRIEF DESCRIPTION OF DRAWINGS

FIG. 1 is a schematic diagram of a cooling system in accordance with the present invention;

FIG. 2 is a cross-sectional view of a packaging assembly for use with the cooling system of FIG. 1 with the general location of the chips being indicated relative to the cooling system and showing an enlarged view of a portion of the computer of FIG. 1;

FIG. 3 illustrates the mounting and interconnection of certain of the components within the assembly of FIG. 2; and FIG. 4 shows the microscopic cavities formed on the backside of the IC wafer in one embodiment of the present invention.

DESCRIPTION OF A PREFERRED EMBODIMENT

Referring to FIG. 1, there is shown schematically a cooling system which includes a compressor 1 connected in series and then through suitable piping such 2, 3, and 4 to a condenser 6, through a computer module 7 which is to be cooled, and through the evaporator 8 back to the compressor 1. Any refrigerant such as F-12 or F-22 may be used. The packaging and cooling of the computer in accordance with the present invention is shown in more detail in FIG. 2.

Referring to FIG. 2, the base members of wafers 10, 11, 12 and 13 are supported within the chambers formed by support or housing members 14 and 24, by O-rings such as 15, 16; 17, 18; 19, 20; and 21, 22 respectively which provide non-rigid support to the base members. The wafers 10, 11, 12 and 13 are made of silicon although other materials such as silicon carbide or ceramic could be used. It is to be noted that there may be additional wafers and associated O-rings in a complete computer depending on the size and complexity of the computer 7. The support members such as 14 and 24 are secured together and to adjacent support members 24A, 24B, and 24C through suitable fastening means such as an exterior surrounding housing (not shown) or by long bolts such as 75. This facilities assembly of the structure or disassembly for purposes or repair or maintenance. The piping 3 connects through manifold 23 to coolant inlets 25, 26, 27, 28 and 29 to deliver coolant to one or both sides of the wafers 10, 11, 12 and 13. While the structure is the same surrounding all of the wafers 10, 11, 12, and 13, FIG. 2 only illustrates the details of the cooling structure surrounding wafer 11.

Referring to the structure surrounding wafer 11, it is seen that the internal support members 14 and 24 form generally cylindrical shaped chambers such as 30 into which a wafer such as 11 is centrally located. The manifold directs liquid refrigerant 32 through the coolant inlets 26 and 27, and through inlets 34, 35, 36, 37, 38, 39, 40, and 41 as a liquid jet or spray on both sides of wafer 11.

A pressure reducer may be provided by the relatively small diameter capillary tubes or inlets such as 26 and 27, and 34 through 41. Spend coolant exits the chamber 20 through the bottom by tubes 44 and 45 to the coolant exit manifold 47, which connects to pipe 4. An alternative to sizing the capillary tubes 26 and 27 and 34-41 of the manifold 23 is to use an expansion valve shown schematically as 50 in pipe 3.

In operation, spraying the liquid coolant on one or both sides of the silicon wafers such as 11 which serve as substrates for the high density ICs mounted and interconnected thereon provides simultaneous high velocity convective cooling and phase change boiling heat transfer. The mixture of gaseous and excess liquid refrigerant 32 is extracted from the bottom of chamber 30 through orifices 44 and 45 and manifold 47. Pumping is done on the working fluid in its vaporous state but could be done in the liquid state without a condenser. The refrigerant 32 is then passed through pipe 4 to evaporator 8 where the positive heat transfer vaporizes the liquid before it re-enters the compressor 1.

An example of the fabrication of the wafers 10, 11, 12 and 13 is shown in FIG. 3. Referring to FIG. 3, a number of IC chips or dies 51 and 52 are interconnected through solder balls 53, 54, 55 and 56 to connectors 57, 58, and 59 on the surface of wafer 11 in a mounting technique known as "flip-chip" although any suitable mounting arrangement on wafer 11 may be used. Wafer 11 acts as a heat sink such that cooling the side of the wafer which is opposite the side to which the ICs 51 and 52 are mounted will contribute to the cooling of the ICs as well as directly cooling the ICs and side of wafer 11 on which the ICs are mounted.

The ICs such as 51 and 52 are positioned on the wafer 11 so that the spray of coolant 32 from inlets or orifices 34 and 35 lands on both sides of the site of IC 51, while the spray of coolant 32 from orifices 36 and 37 lands on both sides of the site of IC 52.

It is possible to control the degree of cooling in response to temperature of the wafer 11 through multiple temperature sensors positioned on both sides of the wafer 11. It was found that an array of p-type (boron) diffused resistor temperature sensors may be fabricated over the wafer "surface" or alternatively may be fabricated as part of the ICs 51 and 52 as shown in FIG. 3. Referring to FIG. 3 the temperature sensor array is provided by the temperature sensors 60, 61 and 62 fabricated in the wafer surface, while 63 is a temperature sensor fabricated in the IC 51 by deposition. The temperature sensors are connected through suitable electrical connections such as 64 to the controls for the cooling system shown diagrammatically as control 65 in FIG. 1. Other thermistors such as a large thin film of metal such as aluminum configured in a serpentine fashion on the surfaces of wafer 11 can be substituted for the boron temperature sensors 61, 62 and 63.

As is well known in the art, the cooling system may be turned on or off and the rate of cooling controlled in response to the signal provided by the temperature sensors 60, 61, and 62 or 63. While only three temperature sensors 60, 61, and 62 are shown in the array for wafer 11, in practice a sufficient number spread over the wafer 11 will be used. Similarly, one or more temperature sensors 63 fabricated as part of one or more of the separate ICs may be utilized.

Also, as shown in FIG. 1, the control 65 is also used to respond to temperatures which exceed the safe range of operating temperature for the computer 7, to disconnect the power supply 68 for the computer 7 through activation of disconnect switch or relay control 66. Thus, in the event of a malfunction which causes the temperature within the computer 7 to exceed safe limits, the power supply 68 to the computer 7 will be disconnected. The power disconnect can be for all, or only the applicable zone, of the computer.

The present invention provides improved cooling of the ICs within computer 7. Heat removal rates well in excess of 100 watts per square centimeter have been obtained with vapor impingement velocities in the order of 10 meters per second, and heat removal rates in excess of 1000 watts per square centimeter are deemed possible.

In one embodiment of the invention the heat transfer and hence cooling was enhanced by etching cavities on the wafer in areas not occupied by the ICs. FIG. 4 shows the microscopic cavities etched such as by anistropical etching on the wafer 11 (only a portion of which is shown) to increase the surface area. Pyramids 70 were formed with sidewalls at an angle of 54.7 degrees to the surface with a characteristic dimension of 0.01 millimeters or 0.005 inches increasing the surface area for heat removal by over 70%.

Other modifications may be made within the scope and spirit of the present invention. Sets of wafers 10, 11, 12 and 13 could be stacked on top of each other with the manifolds 23 and 47 being double sided to accommodate a stack above plus a stack below the manifold.

While the invention has been described in connection with wafer 11 and chamber 30, it is to be appreciated that the description and operation apply equally well to the wafers and chambers associated with the wafers 10, 12 and 13 and their modules which are essentially the same as wafer 11 and its module.

Referring again to FIG. 2, it is to be noted that the ends of the wafers 10, 11, 12 and 13 are outside the chamber 30 to provide easy access for electronic connections through edge connectors such as 71. Also radial changes in dimensions due to thermal expansion of the wafers such as 11 are accommodated by the non-rigid O-ring seals 17 and 18. In addition, in the double sided cooling, the inertial forces of the two opposing streams of liquid such as from orifices 34 and 35 offset each other. If cooling is accomplished by a stream of coolant on only one side of the wafers such as 11, then a breather passage 76 connecting the chambers on either side of the wafer can be provided to equalize the pressure between sides. Furthermore, it is to be noted that the silicon wafers such as 11 are mounted between modular supports which enable easy insertion and removal.

We claim:

1. An integrated circuit assembly comprising:

A housing defining at least one chamber therein;

Means within said housing to support a base member within the central region of said chamber;

One or more integrated circuit chips carried on said base member and in heat conducting contact therewith;

Orifices positioned within said housing in regions adjacent to said one or more integrated circuit chips;

Means to deliver a cooling fluid through said orifices under pressure so that it is directed as a jet of fluid against said base member in the region of said one or more integrated circuit chips;

Means to return said cooling fluid to a cooling system to extract heat carried by said fluid from said chamber;

Said cooling fluid being directed against said one or more integrated circuit chips resulting in the boiling of at least some of said fluid;

Said orifices being positioned in pairs on opposite sides of said base member;

Said support means are non-rigid; and

Said base member is substantially flat and extends beyond said chamber to enable electrical connections to be made to the ends thereof.

2. The integrated circuit assembly of claim 1 wherein said housing defines multiple chambers and said means to deliver a cooling fluid and means to return said cooling fluid from said multiple chambers includes manifolds attached to said housing.

3. The integrated circuit assembly of claim 1 wherein the means to deliver a cooling fluid is a manifold connected to multiple chambers in the housing and to multiple chambers in an adjacent housing.

4. The integrated circuit assembly of claim 1 wherein said base member is silicon.

5. An integrated circuit assembly of claim 4 wherein portions of the base member are etched anistropically to increase the surface area thereof.

6. An integrated circuit assembly of claim 5 wherein said etching forms pyramids in cavities of said silicon base member.

7. An integrated circuit assembly of claim 5 wherein at least one temperature sensor is positioned within said chamber to monitor the temperature.

8. An integrated circuit assembly of claim 7 wherein said temperature sensor provides a signal to control the cooling fluid.

9. An integrated circuit assembly of claim 7 wherein said temperature sensor is mounted on said base member.

10. An integrated circuit assembly of claim 8 wherein said temperature sensor is connected to a switch to disconnect the power to said one or more integrated circuit chips in the event the temperature sensed by said temperature sensor exceeds a predetermined value.

11. An integrated circuit assembly of claim 4 wherein at least one temperature sensor is mounted on said base member to provide a signal to control the cooling fluid in accordance with said temperature sensor and to activate a switch to disconnect the power to said one or more integrated circuit chips in the event the temperature sensed by said temperature sensor exceeds a predetermined amount.

12. The integrated circuit assembly of claim 11 wherein said at least one temperature sensor is deposited on said base member.

13. The integrated circuit assembly of claim 12 wherein said base member is silicon.

14. The integrated circuit assembly of claim 13 wherein said at least one temperature sensor is a thin film of metal.

15. The integrated circuit assembly of claim 1 wherein said base member divides said chamber into two substantially equal smaller chambers, and a breather passage through said base member equalizes the pressure in said substantially equal smaller chambers.

16. The integrated circuit assembly of claim 1 wherein said support means includes at least two separable support members cooperating with an O-ring to provide said non-rigid support means to said base member within said housing, and fastening means to secure said support members into engagement with said O-ring, thereby facilitating the assembly and disassembly of said integrated circuit assembly.

* * * * *